United States Patent
Bovaird et al.

(10) Patent No.: US 10,068,817 B2
(45) Date of Patent: Sep. 4, 2018

(54) SEMICONDUCTOR PACKAGE

(71) Applicant: MACOM Technology Solutions Holdings, Inc., Lowell, MA (US)

(72) Inventors: Paul Bovaird, Pleasanton, CA (US); Stefano D'Agostino, Los Altos, CA (US); Vikas Manan, Cupertino, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 15/464,100

(22) Filed: Mar. 20, 2017

(65) Prior Publication Data

US 2017/0271221 A1   Sep. 21, 2017

Related U.S. Application Data

(60) Provisional application No. 62/310,619, filed on Mar. 18, 2016.

(51) Int. Cl.
*H01L 23/055* (2006.01)
*H01L 23/66* (2006.01)
*H01L 23/367* (2006.01)

(52) U.S. Cl.
CPC .......... *H01L 23/055* (2013.01); *H01L 23/66* (2013.01); *H01L 23/367* (2013.01);
(Continued)

(58) Field of Classification Search
CPC ... H01L 23/367; H01L 23/3677; H01L 23/66; H01L 2023/4037; H01L 2023/40343;
(Continued)

(56) References Cited

U.S. PATENT DOCUMENTS 5,465,626 A * 11/1995 Brown ............... G01L 19/0038
                                                    73/706
5,646,446 A *  7/1997 Nicewarner, Jr. ... H01L 23/5387
                                                   257/723
(Continued)

FOREIGN PATENT DOCUMENTS

CN    104779228 A    7/2015
KR    100251863 B1   4/2000

OTHER PUBLICATIONS

Chen, MS.W. et al., "Thermal investigation for multiple chips 3D packages", 10th Electronics Packaging Technology Conference, ISBN-13 9781424421183, EPTC 2008, © 2008 IEEE, Abstract only, date unknown.

(Continued)

*Primary Examiner* — Earl Taylor
(74) *Attorney, Agent, or Firm* — Weide & Miller, Ltd.

(57) ABSTRACT

A semiconductor package and die assembly with a package having an exterior surface and an interior space, the interior space defined by a first side wall, and a second side wall that opposes the first side wall. Also part of the assembly is a package floor and a package ceiling. The package floor includes package floor conductors. The package ceiling opposes the package floor and includes package ceiling conductors in the package ceiling. One or more semiconductor dies are on the floor of the package floor. Electrical conductors electrically connect the one or more floor dies to the package floor conductors. One or more semiconductor dies are located on the package ceiling. Electrical conductors are configured to electrically connect the one or more ceiling dies to the package ceiling conductors. An air space is located between the package floor and the package ceiling.

13 Claims, 5 Drawing Sheets

(52) U.S. Cl.
CPC ............... *H01L 2223/6616* (2013.01); *H01L 2224/48091* (2013.01); *H01L 2924/19105* (2013.01)

(58) Field of Classification Search
CPC .......... H01L 2023/405; H01L 2223/66; H01L 2223/6605; H01L 2223/6644; H01L 2924/1421; H01L 2225/06582; H01L 2225/06503; H01L 2225/065; H01L 2924/19106; H01L 2924/1616; H01L 2924/16152
See application file for complete search history.

(56) References Cited

U.S. PATENT DOCUMENTS

| | | | | |
|---|---|---|---|---|
| 6,590,282 | B1* | 7/2003 | Wang | H01L 25/0657 257/685 |
| 6,822,162 | B1* | 11/2004 | Valentine | H01L 23/10 174/360 |
| 7,074,645 | B2* | 7/2006 | Huang | H01L 21/561 257/E23.092 |
| 7,412,120 | B2* | 8/2008 | Yamamoto | G02B 6/42 385/14 |
| 7,665,207 | B2* | 2/2010 | Fraley | H01L 23/145 174/260 |
| 7,671,474 | B2* | 3/2010 | Dirks | H01L 23/3107 257/760 |
| 8,704,370 | B2* | 4/2014 | Uehling | H01L 24/83 257/738 |
| 8,884,425 | B1* | 11/2014 | Mohammed | H01L 23/49827 257/706 |
| 9,054,119 | B2* | 6/2015 | Hauenstein | H01L 23/34 |
| 9,111,870 | B2* | 8/2015 | Vincent | H01L 24/30 |
| 9,123,685 | B2* | 9/2015 | Yap | H01L 23/367 |
| 9,129,958 | B2* | 9/2015 | Mallik | H01L 25/0652 |
| 9,190,399 | B2* | 11/2015 | Lamorey | H01L 25/18 |
| 9,245,813 | B2* | 1/2016 | Bartley | H01L 23/373 |
| 9,362,233 | B2* | 6/2016 | Goetz | H01L 23/552 |
| 9,530,715 | B2* | 12/2016 | Yu | H01L 23/3114 |
| 9,646,857 | B2* | 5/2017 | Glascock | H01L 21/565 |
| 9,735,130 | B2* | 8/2017 | Pan | H01L 23/04 |
| 9,780,010 | B1* | 10/2017 | Zhao | H01L 23/3142 |
| 9,793,237 | B2* | 10/2017 | Railkar | H01L 24/81 |
| 9,799,637 | B2* | 10/2017 | Balut | H01L 25/165 |
| 2003/0111714 | A1* | 6/2003 | Bates | H01L 23/66 257/678 |
| 2003/0202755 | A1* | 10/2003 | Iceman | G02B 6/4214 385/92 |
| 2005/0100290 | A1* | 5/2005 | Huang | G02B 6/4201 385/92 |
| 2005/0259911 | A1* | 11/2005 | Yamamoto | G02B 6/42 385/14 |
| 2006/0145356 | A1* | 7/2006 | Liu | H01L 23/36 257/777 |
| 2007/0187836 | A1* | 8/2007 | Lyne | H01L 25/0657 257/777 |
| 2008/0115967 | A1* | 5/2008 | Giboney | H05K 9/0024 174/351 |
| 2008/0197464 | A1* | 8/2008 | Dirks | H01L 23/3107 257/676 |
| 2009/0051018 | A1* | 2/2009 | Moline | H01L 21/568 257/675 |
| 2009/0127676 | A1* | 5/2009 | Gomez | H01L 23/3107 257/666 |
| 2009/0127686 | A1* | 5/2009 | Yang | H01L 24/82 257/686 |
| 2011/0254123 | A1* | 10/2011 | Sellathamby | H01L 23/48 257/531 |
| 2013/0194754 | A1* | 8/2013 | Jung | H01L 23/5385 361/720 |
| 2013/0200528 | A1* | 8/2013 | Lin | H01L 21/6836 257/774 |
| 2015/0001689 | A1* | 1/2015 | Goetz | H01L 23/552 257/659 |
| 2015/0001701 | A1* | 1/2015 | Li | H01L 23/02 257/713 |
| 2015/0061139 | A1* | 3/2015 | Yap | H01L 24/26 257/773 |
| 2015/0108661 | A1* | 4/2015 | Vincent | H01L 24/30 257/777 |
| 2015/0162307 | A1* | 6/2015 | Chen | H01L 25/0655 257/712 |
| 2015/0179616 | A1* | 6/2015 | Lin | H01L 25/50 257/773 |
| 2015/0255429 | A1* | 9/2015 | Katkar | H01L 25/0657 257/712 |
| 2015/0364830 | A1* | 12/2015 | Tong | H01Q 19/10 342/27 |
| 2015/0380384 | A1* | 12/2015 | Williams | H01L 24/97 438/112 |
| 2016/0064355 | A1* | 3/2016 | Pan | H01L 25/0657 257/704 |
| 2016/0359520 | A1* | 12/2016 | Goetz | H01L 23/552 |
| 2017/0084554 | A1* | 3/2017 | Dogiamis | H01L 23/66 |
| 2017/0110434 | A1* | 4/2017 | Railkar | H01L 24/81 |
| 2017/0132506 | A1* | 5/2017 | Blythe | G06K 19/0772 |
| 2017/0162542 | A1* | 6/2017 | Chen | H01L 25/0655 |
| 2017/0194308 | A1* | 7/2017 | Evans | H01L 25/18 |
| 2017/0229368 | A1* | 8/2017 | Chiu | H01L 23/3675 |
| 2017/0229426 | A1* | 8/2017 | Hung | H01L 25/50 |
| 2017/0236808 | A1* | 8/2017 | Balut | H01L 24/49 257/700 |
| 2017/0271221 | A1* | 9/2017 | Bovaird | H01L 23/055 |

OTHER PUBLICATIONS

Sharma, G., et al., "Design and Development of Multi-Die Laterally Placed and Vertically Stacked Embedded Micro-Wafer-Level Packages", IEEE Transactions on Components, Packaging and Manufacturing, ISSN 2156-3950, Jan. 2011 Technology, Abstract only.

* cited by examiner

SEMICONDUCTOR PACKAGE

PRIORITY CLAIM

This application claims priority to and the benefit of U.S. Provisional Patent Application 62/310,619 filed on Mar. 18, 2016, the contents of which are incorporated by reference in its entirety herein.

FIELD OF THE INVENTION

The innovation relates to semiconductor package, and in particular to a semiconductor package having components on the floor and ceiling of an interior space of the package.

RELATED ART

Prior art package designs are shown in FIGS. 1 and 2. These package designs, while acceptable for certain applications, suffer from several drawbacks. One such drawback is that because all the components are located on the floor of the package interior. This invention allows an optimized used of the internal available real estate. Passive components such as inductors capacitors and resistors can be located on the floor of the package.

In addition, the heat dissipation from the electrical components is an important aspect of package and component design. Excess heat can limit operating parameters and degrade lifetime of the device before failure when all the components are located on one side of the package.

Yet another limiting factor is the limited space associated with many electronic devices. As electronic devices are made to be smaller and smaller, the area on a PCB and on a package is likewise limited. The prior art package shown in FIGS. 1 and 2 do not improve component density, which is one way to maximize electrical processing capability per package and PCB area.

SUMMARY

To overcome the drawbacks of the prior art and provide additional benefit, disclosed herein is a semiconductor package and die assembly. In one embodiment, the assembly includes a package having an exterior surface and an interior space. The interior space defined by a first side wall, and a second side wall that opposes the first side wall. Also part of the assembly is a package floor and a package ceiling. The package floor includes package floor conductors in the package floor. The package ceiling opposes the package floor and includes package ceiling conductors in the package ceiling. One or more floor dies are on the floor of the package floor, and the floor dies comprising semiconductor dies. Electrical conductors electrically connect the one or more floor dies to the package floor conductors. One or more ceiling dies that comprise semiconductor dies are located on the package ceiling. Electrical conductors are also part of the assembly and are configured to electrically connect the one or more ceiling dies to the package ceiling conductors.

In one embodiment, the assembly further comprises an air space located between the package floor and the package ceiling, the air space extending from the first side wall to the second side wall. It is also contemplated that the assembly may comprise wall conductors located in the first side wall, the second side wall or both, such that the wall conductors are electrically connecting the package ceiling conductors to the package floor conductors. In one embodiment, the wall conductors comprise RF and DC interconnection via. The assembly may also include a high frequency connector on the side wall or ceiling. The high frequency connector may be located in either the first side wall or the second side wall, or third side wall or a fourth side wall. The assembly may also include an upper heat sink located on the package ceiling. In one configuration, the assembly further comprises heat conductors in the package ceiling that connect to the heat sink. The package ceiling may be further configured as a heat sink.

Also disclosed is a semiconductor package comprising a package floor having an upper surface and a lower surface. The package floor includes package floor conductors in the package floor or on the upper surface of the package floor. One or more side walls extend upward from the package floor and a package ceiling is supported by the side walls. The package ceiling has an exterior surface and an interior surface, the interior surface opposes the upper surface of the package floor and connects to the one or more package walls. The package ceiling includes package ceiling conductors in or the interior surface of the package ceiling. One or more floor dies comprising semiconductor dies are located on the package floor. Also part of this configuration are one or more electrical conductors electrically connecting at least one of the package floor conductors to at least one of the package ceiling conductors.

In one embodiment, the one or more side walls are at an outer edge of the package floor. The semiconductor package may further comprise a high frequency connector in at least one of the one or more side walls. In one embodiment, the electrical conductors that electrically connect at least one of the package floor conductors to at least one of the package ceiling conductors comprise RF and DC interconnection vias. Also part of this embodiment is an optional heat sink on or in the package ceiling. In one embodiment, the semiconductor package has an air space located between the package floor and the package ceiling. This air space may extend from a first side wall to a second side wall.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
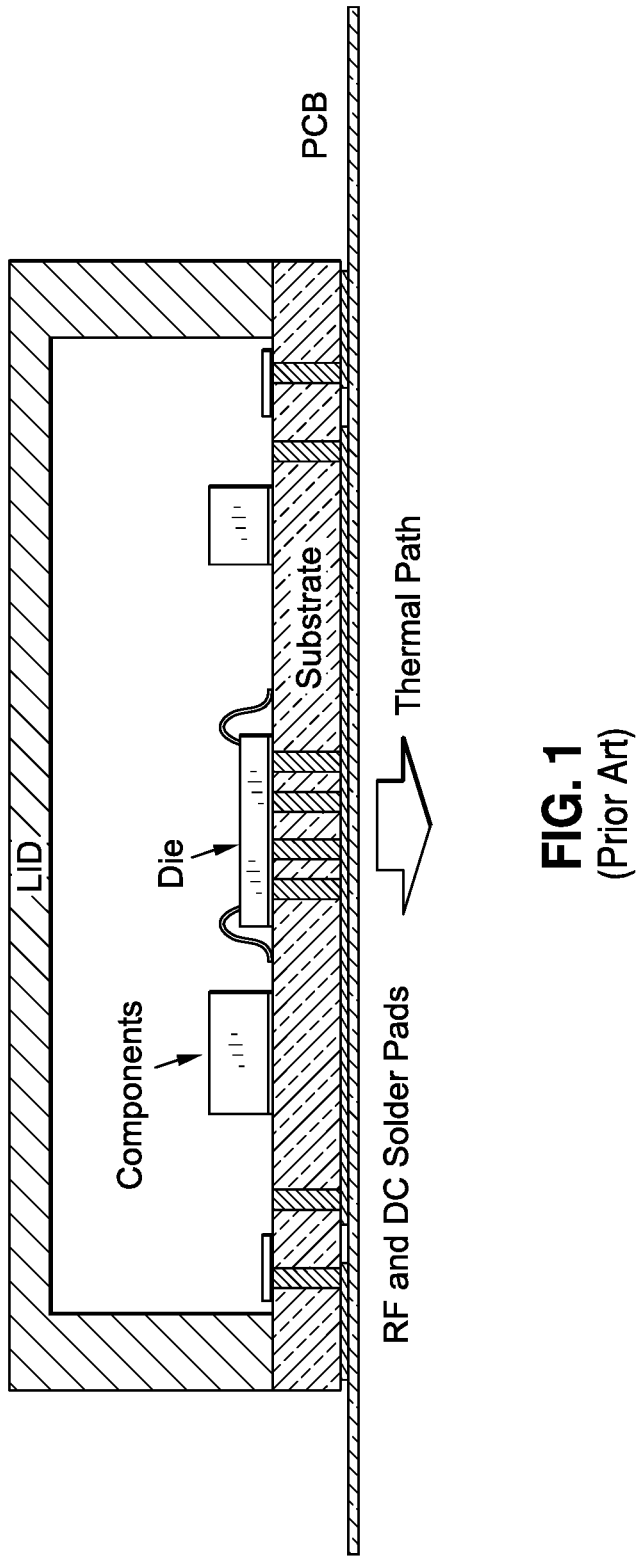
FIG. 1 illustrates a side view of a prior art package design.
Figure 2:
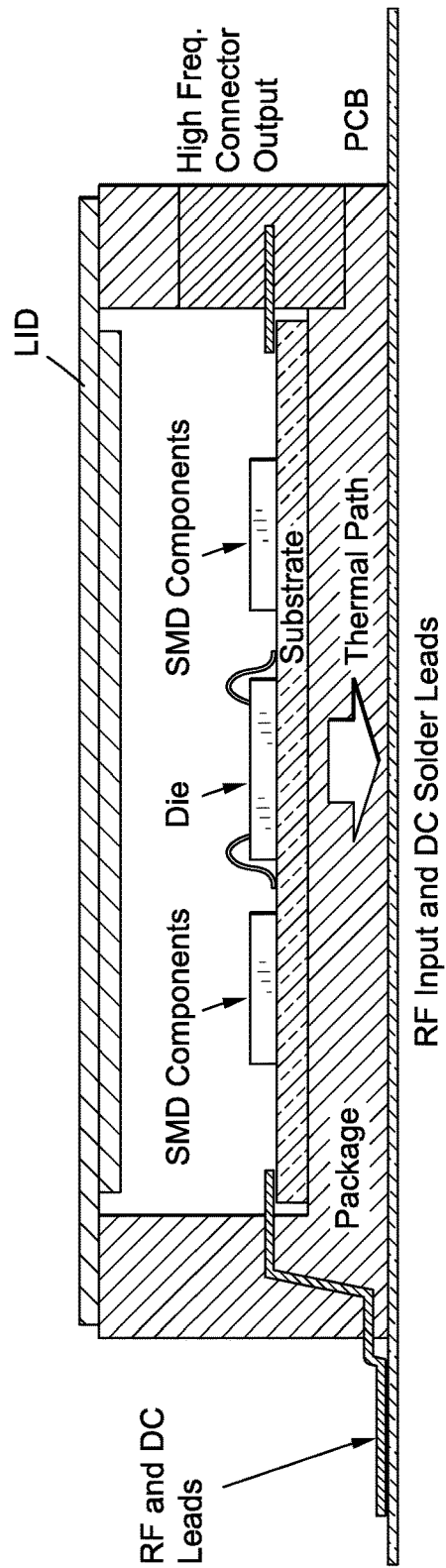
FIG. 2 illustrates a side view of a prior art package design.
Figure 3:
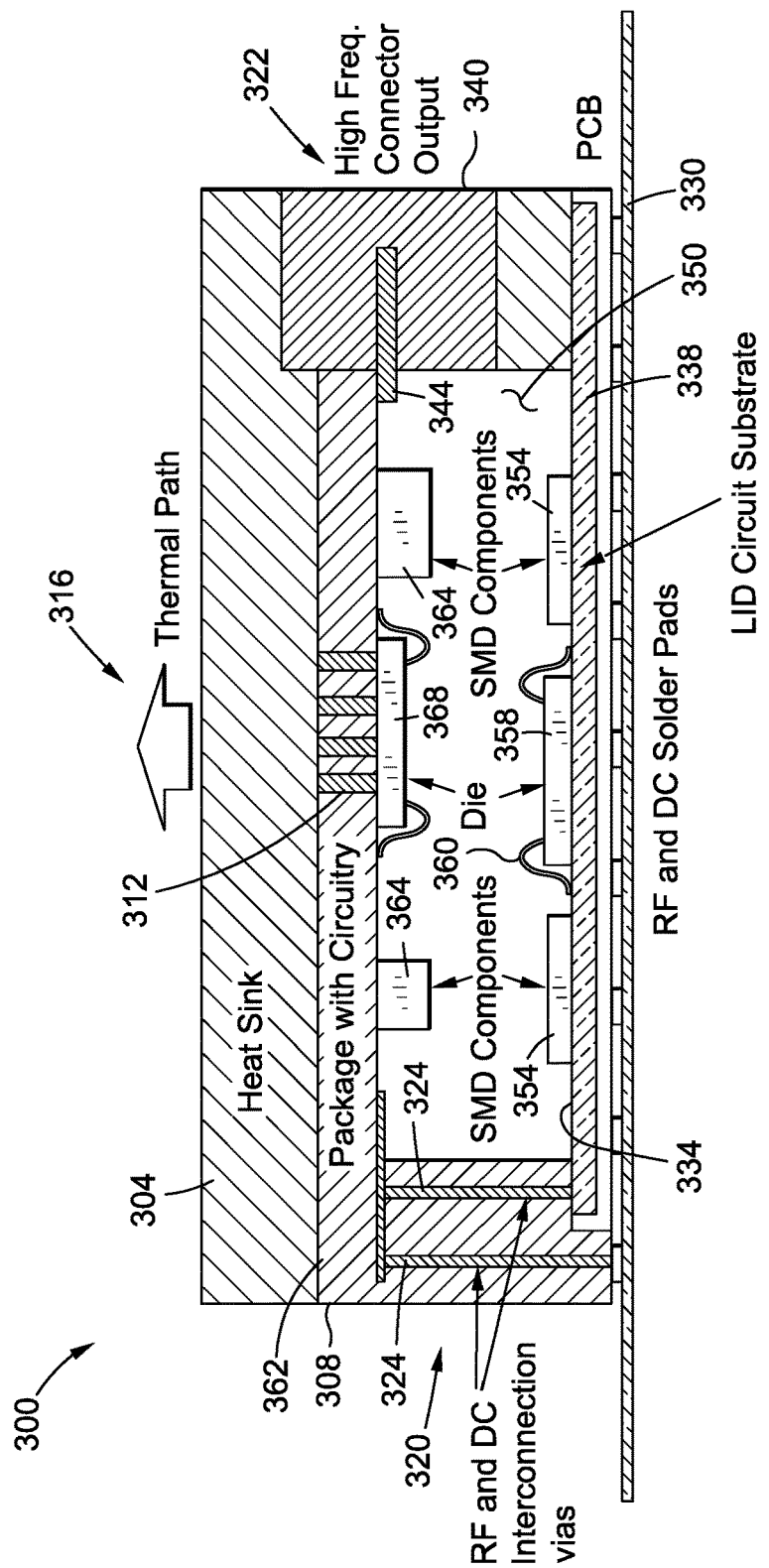
FIG. 3 illustrates a side view of an improved package design with side wall connector.

To overcome the drawbacks of the prior art and provide additional benefit, a new package and device configuration is disclosed. As shown in FIG. 3, the package 300 includes numerous elements. At the top of the package is an optional heat sink 304 that may be part of the package 300 or connected to the package to establish a thermal path 316 for heat from the interior of the package. The heat sink may be made of metal or any other thermally conductive material in any configuration. Below the heat sink 304 is a package ceiling 308 that may include one or more heat paths 312 configured to conduct heat from the package interior or components to the heat sink.

Below the package ceiling 308 are package side walls 320 which support the package ceiling 308 and heat sink 304. In this embodiment, the left hand side wall includes electrical conductors 324 that conduct electrical signals from the package ceiling 308 to the lower portion of the package 334. In this example embodiment, the side wall conductors 324 include signal conductors and a ground path. One or more of the side wall conductors 324 terminate in a solder pad at the bottom of the package, which in turn connects to a printed circuit board 330 or any other support surface for the package 300. Another of the side wall conductors 324 may connect to the package floor 338 to electrically connect the package ceiling 308 to the package floor 338. One or more additional electrical connections between the package 308 and the PCB 330 may exist as would be understood by one of ordinary skill in the art. Such connections may be solder balls, or solder pads, or any other type connections.

In this embodiment, the right hand side wall 322 of the package 300 includes a connector 340 that includes a conductor pin 344 that electrically connects to the ceiling 308 or the floor 338. In the example embodiment the connector is a G3PO connector, but in other embodiments, different types of connectors may be incorporated, either standard or custom. Other types of high speed or high frequency interfaces may be used other than a connector type configuration. Although shown as one connector 340, it is contemplated that each package 300 may incorporate multiple connectors or capability to electrically connect to multiple connectors. The connector pin or any portion of the connector can connect whether to the ceiling or the floor based on the package and circuit design.

The bottom of the package 300 is defined by the Lid circuit substrate 338, which is also part of the package. The package ceiling and lid 338 may comprise any material capable of forming a package. In this example embodiment, the package ceiling 308 and the floor 338 include one or more electrical conductor in or on one or more surfaces or areas of the package. Thus the ceiling 308, side walls 324, and floor 338 may be configured with electrical conductors.

An interior space 350 is defined by the ceiling 308, side walls, 324, 322, and the floor 338. The floor 338 includes a floor surface 334 to which one or more floor components 354, such as surface mount components, and/or one or more floor dies 358, are connected. The floor components 354 and floor dies 358 may be connected to the floor surface 338 by solder, epoxy, resin or any other means. In this embodiment, bond wires 360 electrically connect the floor die 358 to the floor surface 334. In other embodiments, other types of electrical connections may occur between the components 354 and the floor dies 358 and/or floor components 354 to the floor surface 334. The floor components 354 and the floor dies 358 electrically connect the one or more electrical conductors in or on the floor 338.

The ceiling 308 includes a ceiling surface 362 to which one or more ceiling components, such as surface mount components, and/or one or more ceiling dies 368 are connected. The ceiling components 364 and floor dies 368 may be connected to the ceiling surface 362 by solder, epoxy, resin or any other means. In this embodiment, bond wires 370 electrically connect the ceiling die 368 to the ceiling surface 362. In other embodiments, other types of electrical connections may occur between the ceiling components 364 and the ceiling dies 368 to the ceiling surface 362. The ceiling components 364 and the ceiling dies 368 electrically connect the one or more electrical conductors in or on the ceiling 308. Any type component or element may connect to the floor or ceiling.

It is also contemplated that the electrical connections between the electrical components, whether located on the floor or ceiling, may comprise any type of electrical connection. For example the electrical devices (dies or packages) may be connected to the floor or ceiling with, or other elements within the device with a flip-chip arrangement, solder bumps, wire bonding, flat package through-hole package, surface mount, chip carrier, pin grid array, flat package, small outline package, chip-scale package, ball grid array, transistor, diode, small pin count IC packages, multi-chip packages, down bonding, or any other attachment scheme.

Between the floor surface 334 and the ceiling surface 362 is an air gap or air space 350. In one embodiment, the air gap extends from side wall 324 to side wall 320 without interruption. In one embodiment, the air gap 350 extends without interruption between the dies 368, 358. The air gap is shown in a different perspective in FIG. 5. The benefit to the air gap is it provides isolation for high frequency signals and minimizes the negative impacts on the high frequency signals. It also provides for a reworkable assembly in case there are error or failures that need the root cause to be determined. Alternative embodiments would include potting compounds or RF absorbing compounds that encapsulate either the floor or ceiling components.

Figure 4:
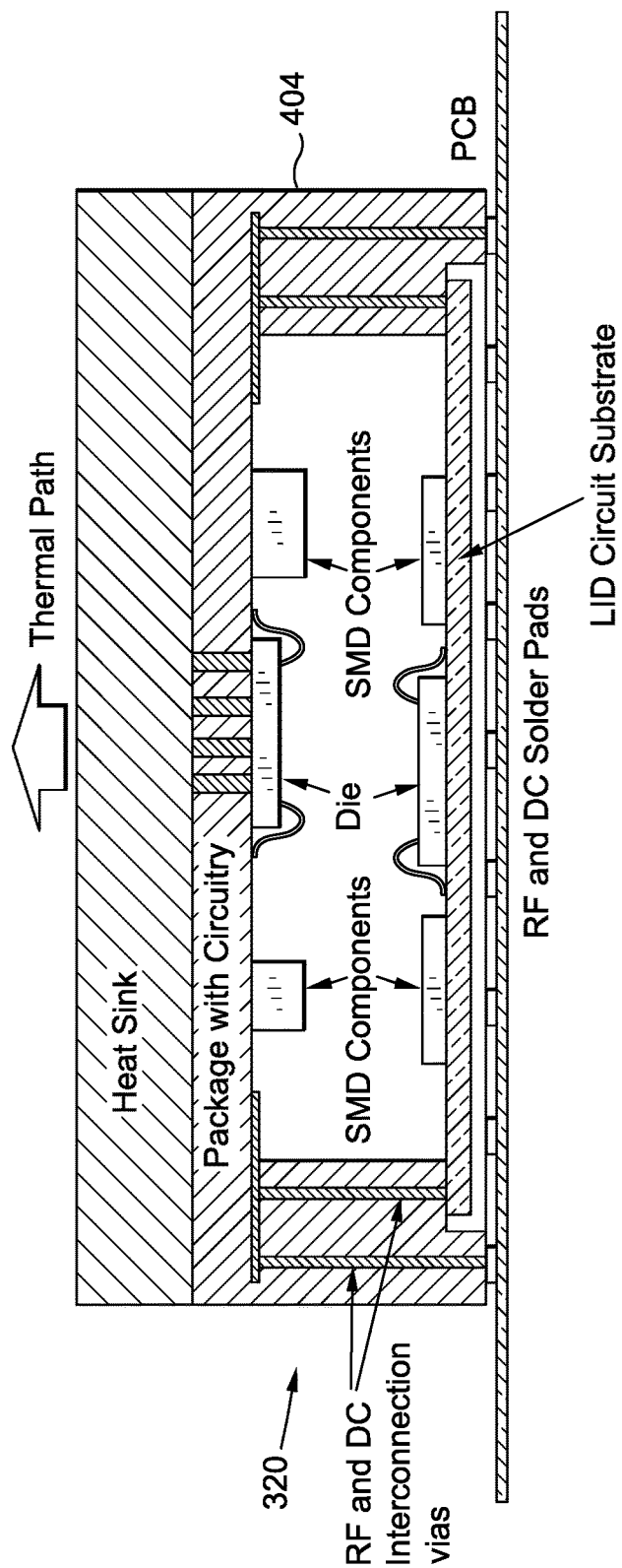
FIG. 4 illustrates a side view of an improved package design without the side wall connector.

The system of FIG. 4 is generally similar to the system of FIG. 3. In the system of FIG. 4, the right hand side wall 404 is generally similar to the left hand side wall 320 and does not include a connector as shown in FIG. 3. The other elements are generally similar and the discussion of those elements is not repeated.

Figure 5:
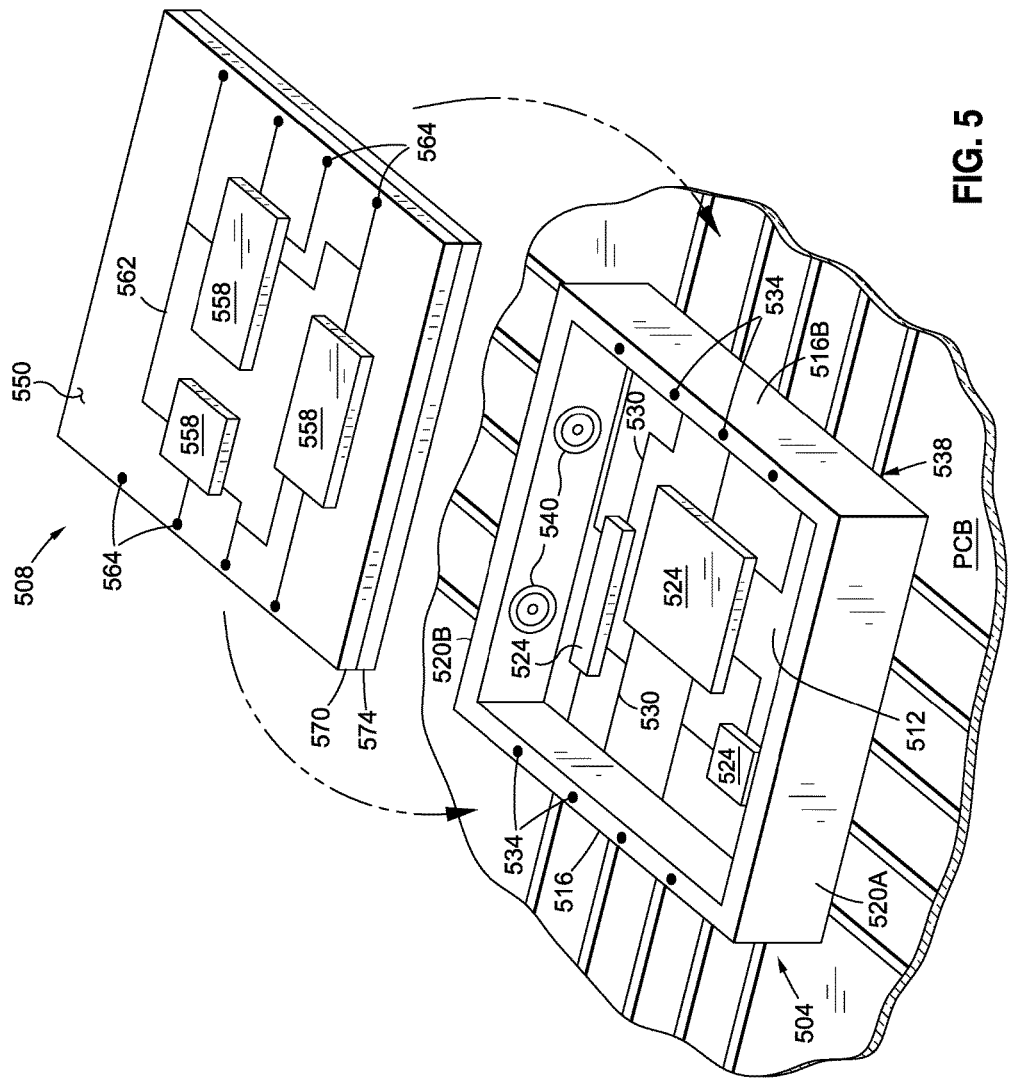
FIG. 5 is a perspective view of an exemplary package base and package lid with exposed interior.

FIG. 5 is a perspective view of the device with lid lifted with the lower part of the package mounted on a PCB. In this embodiment, the package includes a lower section 504 and an upper section or lid 508. The lower section includes a floor 512, opposing side walls 516A, 516B, and opposing side walls 520A, 520B. The package floor 512 is arranged in accordance with typical and traditional packages with one or more floor conductors arranged on or as part of the package.

On the package floor 512 are one or more floor electrical components 524, such as die, packages, or any other component, passive or active, are located on the floor of the package. The floor electrical components 524 may be connected to the floor conductors 530 to allow electrical communication with the floor electrical components 524 to the package. It is contemplated the package has one or more electrical conductors on the exterior of the package to allow for electrical signal propagation between the package exterior and the package interior.

The side walls 516, 520 of the package 504 extend upward form the package floor 512 as shown. In this embodiment, the side walls 516A, 516B include side wall conductors 534 that extend upward. The conductors may be in the side wall 516, or on the interior or exterior surface of the side walls. It is contemplated that one or more of the side walls 516, 520 may include conductors. The side wall conductors 534 may connect to the floor conductors 530, a package exterior conductor 538, or directly to the floor electrical components 524 in the package 504. The package exterior conductors 538 may extend around the entire package or only be at certain locations. The package may also or alternatively have solder bumps on the bottom of the package. Although shown for purposes of discussion with only four side wall conductors, it is contemplated that any additional number of conductive paths may be in the side walls 516A, 516B.

Also shown in the side walls 520 are one or more input/outputs 540, such as high frequency connectors configured to provide input to or output from the package. It is contemplated that the input/outputs 540 connectors connect to one or more floor electrical components 524 within the package, side wall conductors 534, or both. Example of the inputs/outputs 540 include but are not limited to GPPO and G3PO High Frequency Connectors.

Also shown is an interior side 550 of a package lid 508. When assembled, the lid 508 would rotate downward to establish the interior side 550 of the lid facing the package floor 512. On the package lid the interior surface 550 has one or more lid electrical components 558 which are connected by lid conductors 563. The lid 508 contains the lid conductors 562 on or in the lid. The material that forms the lid may be any type material, which is typically an insulator which is used to form existing packages or circuit boards. On the lid 508 are one or more side wall conductor connection points 564 that align with or otherwise electrically connect to the side wall conductors 534. It is contemplated that the lid conductors 562 may connect to the side wall conductor connection points 564.

Also shown as part of the lid 508 is a two-layer design that includes a conductor layer 570 and a heat sink layer 574. The lid electrical components 558 and lid conductors 562 are on or part of the conductor layer 570. The heat sink layer 574 may be on top of or part of the conductive layer, or both, and is configured to draw heat out of the interior space of the package 504 and from the lid electrical components 558. The heat sink layer 574 or material may be formed from a high thermal conductivity metal or any other material.

The lid 508 may be attached to the package side walls 516, 520 in any manner including with screws, glue, adhesive, solder connections, or any other manner. The side walls may also be configured with heat sinks or fins. The interior of the package 504 may be filled with filler, such as epoxy, or the interior space between the walls, floor, and the lid may be open to allow for heat movement. In one embodiment, the interior is sealed from the exterior. In another embodiment, the interior is at least partially open to allow for heat flow and air flow between the interior and the exterior. In one embodiment, air flow is assisted through mechanical means such as a microfan or other device to promote air flow. The floor electrical components and the lid electrical components may comprise any type component such as SMD components, epoxy mounted components or any other type of component. The package 504 may be configured to mount to a printed circuit board, another package of this or another design, or any other device.

As shown, the package 500 includes the upper heat sink 510 which in this embodiment is made from a high thermal conductivity metal. The side walls 504 support the ceiling and heat sink 510. The connector interface 508 is also shown in this figure. The coaxial connectors could be on one side or multiple sides.

The disclosed design includes many benefits over the prior design. One benefit is that this design, which locates components and/or dies on the floor and the ceiling, is a higher component/die density per unit of area than prior art designs which only located components/dies on the floor. Another benefit of this design is that in certain embodiments heat generating components and/or dies, or elements which generate the most heat, will be located on the ceiling, directly near or in contact with the ceiling heat sinks which is the optimal position.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A semiconductor package and die assembly comprising:
    a package having an exterior surface and an interior space, the interior space defined by:
        a first side wall;
        a second side wall that opposes the first side wall;
        a package floor, the package floor including package floor conductors in the package floor; and
        a package ceiling having an interior side that opposes the package floor, the package ceiling including package ceiling conductors in the package ceiling;
    one or more floor dies comprising semiconductor dies located on the package floor;
    electrical conductors electrically connecting the one or more floor dies to the package floor conductors;
    one or more ceiling dies comprising semiconductor dies located on the package ceiling;
    electrical conductors electrically connecting the one or more ceiling dies to the package ceiling conductors;
    an upper heat sink located on the package ceiling; and
    two or more heat conductors in the package ceiling that extend from the interior side of the package ceiling, through the package ceiling, and connect to the heat sink, the two or more heat conductors being separate elements from the upper heat sink.

2. The assembly of claim 1 further comprising an air space locate between the package floor and the package ceiling, the air space extending from the first side wall to the second side wall.

3. The assembly of claim 1 further comprising wall conductors located in the first side wall, the second side wall or both, the wall conductors electrically connecting the package ceiling conductors to the package floor conductors.

4. The assembly of claim 3 wherein the wall conductors comprise RF and DC interconnection via.

5. The assembly of claim 1 further comprising a high frequency connector.

6. The assembly of claim 5 wherein the high frequency connector is located in either the first side wall or the second side wall, or third side wall or a fourth side wall.

7. The assembly of claim 1 wherein the package ceiling is further configured as a heat sink.

8. A semiconductor package comprising:
    a package floor having an upper surface, the package floor including package floor conductors in or on the upper surface of the package floor;
    one or more side walls that extend upward from the package floor;

a package ceiling having an exterior surface and an interior surface, the interior surface opposing the upper surface of the package floor and connecting to the one or more package walls, the package ceiling including package ceiling conductors in or on the interior surface of the package ceiling;

one or more floor dies comprising semiconductor dies located on the package floor;

one or more ceiling dies comprising semiconductor die located on the package ceiling;

one or more electrical conductors electrically connecting at least one of the package floor conductor to at least one of the package ceiling conductors;

an upper heat sink located above the package ceiling; and two or more heat conductors in the package ceiling that extend through the package ceiling to connect to the heat sink such that the two or more heat conductors do not extend below the interior surface of the package ceiling.

9. The semiconductor package of claim 8 wherein the one or more side walls are at an outer edge of package floor.

10. The semiconductor package of claim 8 further comprising a high frequency connector in at least one of the one or more side walls.

11. The semiconductor package of claim 8 wherein the electrical conductors electrically connecting at least one of the package floor conductor to at least one of the package ceiling conductors comprise RF and DC interconnection vias.

12. The semiconductor package of claim 8 further comprising an air space locate between the package floor and the package ceiling.

13. The semiconductor package of claim 12 wherein the air space extends from a first side wall to a second side wall.

* * * * *